United States Patent [19]

Preisler et al.

[11] Patent Number: 5,231,369
[45] Date of Patent: Jul. 27, 1993

[54] RESISTIVE CURRENT LIMITER AND PROCESS FOR PRODUCING IT

[75] Inventors: Eberhard Preisler; Joachim Bock, both of Erftstadt, Fed. Rep. of Germany

[73] Assignee: Hoechst Aktiengesellschaft, Fed. Rep. of Germany

[21] Appl. No.: 893,814

[22] Filed: Jun. 4, 1992

[30] Foreign Application Priority Data

Jun. 18, 1991 [DE] Fed. Rep. of Germany ....... 4119983

[51] Int. Cl.$^5$ .......................... H01C 7/10; H01L 39/00
[52] U.S. Cl. ..................................... 338/20; 338/32 S; 361/19; 505/1
[58] Field of Search ................. 338/20, 32 S; 361/19, 361/141; 505/1; 335/216, 299; 307/99, 131, 135

[56] References Cited

U.S. PATENT DOCUMENTS

| | | | |
|---|---|---|---|
| 3,703,664 | 11/1972 | Cronin | 307/99 X |
| 4,961,066 | 10/1990 | Bergsjö et al. | 338/32 S |
| 4,994,932 | 2/1991 | Okamoto et al. | 361/19 |
| 5,021,914 | 6/1991 | Tsurunaga et al. | 361/19 |
| 5,047,391 | 9/1991 | Bock et al. | 505/1 |
| 5,053,383 | 10/1991 | Short et al. | 505/1 |
| 5,140,290 | 8/1992 | Dersch | 505/1 X |

FOREIGN PATENT DOCUMENTS 0315976 5/1989 European Pat. Off. .
0345767 12/1989 European Pat. Off. .

OTHER PUBLICATIONS von Miller, R., *Lexikon der Energietechnik und Kraftmaschinen* 6:570 (1965).
Buckel, W., "7.2 Kristische Strome in harten Supraleitern" In *Supraleitung*, Germany, Grundlagen und Anwendungen, 1984, pp. 172–173.
Patent Abstracts of Japan, vol. 13, No. 483, Nov. 1989.

*Primary Examiner*—Marvin M. Lateef
*Attorney, Agent, or Firm*—Connolly & Hutz

[57] ABSTRACT

A resistive current limiter takes the form of a hollow cylinder and is composed of high-temperature superconducting material. In this connection, the high-temperature superconducting material may be a polynary oxide.

To produce said resistive current limiter, a homogeneous melt is prepared from an oxide mixture, suitable for forming high-temperature superconductors, in a specified stoichiometry and said melt is allowed to run, at temperatures above 900° C., into a casting zone which rotates about its horizontal axis. The molding, solidified as a cylinder, is removed from the casting zone. The cylinder is sawn so as to produce a gap extending parallel to its axis. Furthermore, a multiplicity of slits are sawn into the cylinder parallel to the gap. Finally, the cylinder is heat-treated for up to 150 hours at 700° to 900° C. in an oxygen-containing atmosphere.

16 Claims, 1 Drawing Sheet

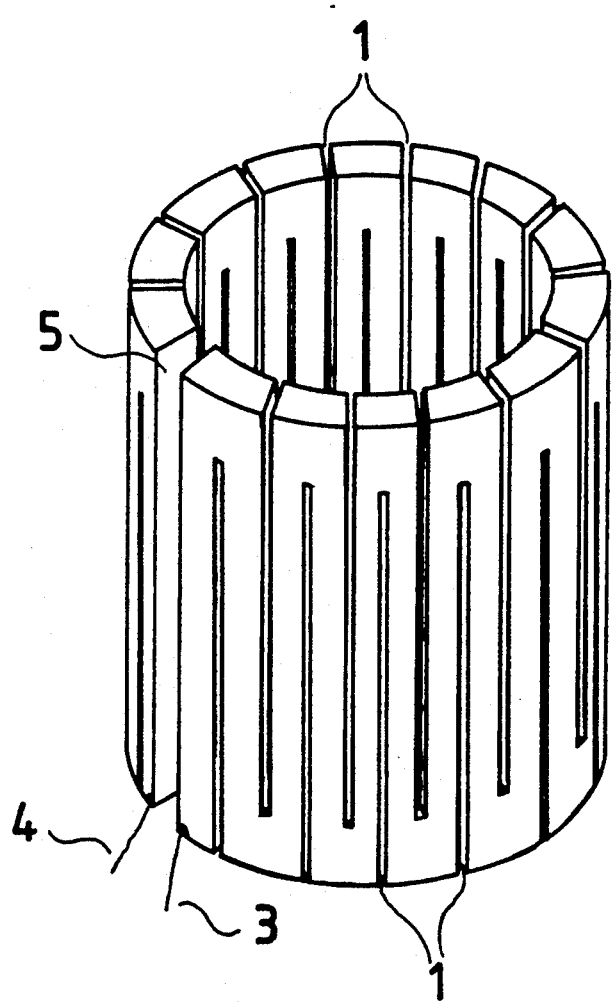

RESISTIVE CURRENT LIMITER AND PROCESS FOR PRODUCING IT

The present invention relates to a resistive current limiter and also to a process for producing it.

BACKGROUND OF THE INVENTION

It is known to use resistive current limiters which switch off the current in less than 1 ms to protect large rectifier installations and other electrotechnical equipment against short-circuit currents which may possibly occur. Such a current limiter comprises a pressure-resistant insulating housing in which there is a current conductor and which contains an explosive capsule which is caused to explode by an ignition pulse. As a result of the explosion, the explosive capsule ruptures the current conductor at a prepared weak point. The sudden current interruption produces a high voltage which conducts the current on to a parallel circuit path comprising a fusible link (cf. "Lexikon der Energietechnik und Kraftmasohinen" ("Lexicon of power engineering and driving machines"), volume 6, 1965, page 570).

It is furthermore known that, in the case of high-temperature superconductors, there is, for every temperature below their critical temperature $T_c$, a critical current density $j_c$, and if it is exceeded, the superconduction breaks down and the conductor exhibits only metallic conductivity (cf. W. Buckel: "Supraleitung" ("Super-conduction"), 3rd edition, 1984, pages 172 and 173).

A disadvantage of the known current limiter is that it is destroyed by the short-circuit current which occurs and therefore has subsequently to be replaced.

SUMMARY OF THE INVENTION

The object of the present invention is therefore to provide a resistive current limiter and a process for producing it, the resistive current limiter being suitable for the multiple occurrence of short-circuit currents. According to the invention, this is achieved as a result of the fact that the resistive current limiter is composed of high-temperature superconducting material and is in the form of a hollow cylinder.

The resistive current limiter in accordance with the invention may also be further developed in that
a) the high-temperature superconducting material is a polynary oxide;
b) the polynary oxide contains bismuth, calcium, strontium and copper;
c) the polynary oxide additionally contains lead;
d) the hollow cylinder has a gap extending parallel to its axis;
e) the width of the gap is not less than 0.5 mm;
f) the hollow cylinder has a multiplicity of slits extending parallel to the gap;
g) the slits in the hollow cylinder are incised alternately from its upper side and from its lower side;
h) the hollow cylinder is connected in an electrically conducting manner to a current supply lead or a current drain lead in each case in the region between the gap and the first slit.
i) the spacing of the slits from one another is so chosen that, if the critical current density is exceeded, the resistance established in the high-temperature superconducting material below its critical temperature has a magnitude which effects a reduction in the critical current.

A resistive current limiter in accordance with the invention can be produced by a process which comprises producing a homogeneous melt from an oxide mixture suitable for forming high-temperature superconductors in a specified stoichiometry allowing the melt at temperatures above 900° C. to run into a casting zone rotating about its horizontal axis, removing the molding, solidified as a cylinder, from the casting zone, sawing the cylinder so as to form a gap extending parallel to its axis, sawing a multiplicity of slits into the cylinder parallel to the gap and, finally, heat-treating the cylinder for up to 150 hours at 700° to 900° C. in an oxygen-containing atmosphere.

The production of the resistive current limiter can, furthermore, also be refined in that
j) the oxide mixture contains bismuth, calcium, strontium and copper;
k) the oxide mixture additionally contains lead;
l) the stoichiometry is specified in accordance with the formula $Bi_2Sr_2CaCu_2O_x$, where x stands for values between 8 and 8.5;
m) the stoichiometry is specified in accordance with the formula $(Bi,Pb)_2Sr_2Ca_2Cu_3O_x$, where x stands for values between 10 and 13.

The resistive current limiter in accordance with the invention, which loses its superconducting properties if a critical current level is exceeded and becomes an ohmic resistor, returns immediately, however, to the superconducting state as soon as there is no supercritical current flowing through it.

The slits in the resistive current limiter in accordance with the invention effect a lengthening of the conductor path through the high-temperature superconducting material.

In the resistive current limiter according to the invention, the maximum current level which can still pass through the current limiter depends on the critical current density of the high-temperature superconducting material below its critical temperature and on the conductor cross section.

In the resistive current limiter in accordance with the invention, the length and the cross section of the high-temperature superconducting material must be designed as a result of the spacing of the slits from one another, and consequently, as a result of their number in such a way that, when the critical current density in the high-temperature superconducting material is exceeded, the resistance established below its critical temperature is so large that a reduction in critical current occurs, i.e. the condition $I_{ohm} < I_{crit.}$ is fulfilled.

BRIEF DESCRIPTION OF THE DRAWING

The accompanying drawing diagrammatically shows an exemplary embodiment of the subject of the invention.

DETAILED DESCRIPTION OF THE INVENTION

The high-temperature superconducting material comprising the hollow cylinder has a gap 5 which is 5 mm wide extending parallel to its axis. Parallel to said gap 5, the hollow cylinder is provided with 27 slits 1 which are incised alternately from the upper and from the lower end of the hollow cylinder. In the region between the gap 5 and the first slit 1 situated on the right, the hollow cylinder is connected in an electrically conducting manner to a current supply lead 3, and in the region between the gap 5 and the first slit 1 situated on the left, it is connected in an electrically conducting manner to a current drain lead 4.

EXAMPLE 800 g of the so-called two-layer compound $Bi_2Sr_2CaCu_2O_x$ (where $x=8.2$) were melted in an aluminium oxide crucible and held for 20 minutes at a temperature of 1030° C. The melt was then introduced via a runner into a horizontally disposed pot rotating at 500 rev/min and having a diameter of 10 cm and a height of 11 cm. After cooling, a hollow cylinder having a diameter of 10 cm, a height of 11 cm and a wall thickness of 4 mm was removed from the pot. The hollow cylinder was heated in air at 750° C. for 24 hours and at 850° C. for 120 hours, as a result of which it became a superconductor having a critical temperature of 91K and a critical current density of 230 $A.cm^{-2}$.

10 cm long slits at spacings of 3.5 mm were then incised into the hollow cylinder alternately from its upper and its lower edge, so that the width of the segments thereby formed was 3 mm. Finally, a slit with a width of 5 mm was run right through so that the hollow cylinder was completely cut through parallel to its axis at one point. On either side of the cut, the hollow cylinder was connected in an electrically conducting manner to one current supply lead or current drain lead in each case. (cf. the figure).

At 77K it was possible to pass an alternating current of 27 A without loss through the hollow cylinder produced in this way, but a higher current was not achieved on increasing the voltage.

We claim:

1. A resistive current limiter comprising a high-temperature superconducting material in the form of a hollow cylinder, and wherein the hollow cylinder has a gap extending parallel to its axis.

2. The resistive current limiter as claimed in claim 1, wherein the high-temperature superconducting material is a polynary oxide.

3. The resistive current limiter as claimed in claim 2, wherein the polynary oxide contains bismuth, calcium, strontium and copper.

4. The resistive current limiter as claimed in claim wherein the polynary oxide additionally contains lead.

5. The resistive current limiter as claimed in claim 3, wherein the width of the gap is not less than 0.5 mm.

6. The resistive current limiter as claimed in claim 5, wherein the width of the gap is not less than 0.5 mm.

7. The resistive current limiter as claimed in claim 5, wherein the hollow cylinder has a multiplicity of slits extending parallel to the gap.

8. The resistive current limiter as claimed in claim 7, wherein the slits in the hollow cylinder are incised alternately from its upper side and from its lower side.

9. The resistive current limiter as claimed in claim 7, wherein a current supply lead is connected to the hollow cylinder on one side of the gap in the region between the gap and first slit, and a current drain lead is connected to the hollow cylinder on the other side of the gap in the region between the gap and the first slit.

10. The resistive current limiter as claimed in claim 7, wherein the spacing of the slits from one another is so chosen that, if the critical current density is exceeded, the resistance established in the high-temperature superconducting material below its critical temperature has a magnitude which effects a reduction in the critical current.

11. A process for producing a resistive current limiter, which comprises producing a homogeneous melt from an oxide mixture, suitable for forming high-temperature superconductors, in a specified stoichiometry allowing the melt to run, at temperatures above 900° C., into a casting zone rotating about its horizontal axis, removing the molding, solidified as a hollow cylinder, from the casting zone, sawing the hollow cylinder so as to form a gap extending parallel to its axis, sawing a multiplicity of slits into the hollow cylinder parallel to the gap and, finally, heat-treating the hollow cylinder for up to 150 hours at 700° to 900° C. in an oxygen-containing atmosphere.

12. The process as claimed in claim 11, wherein the oxide mixture contains bismuth, calcium, strontium and copper.

13. The process as claimed in claim 12, wherein the oxide mixture additionally contains lead.

14. The process as claimed in claim 11, wherein the stoichiometry is specified in accordance with the formula $Bi_2Sr_2CaCu_2O_x$, where x stands for values between 8 and 8.5.

15. The process as claimed in claim 11, wherein the stoichiometry is specified in accordance with the formula $(Bi,Pb)_2Sr_2Ca_2Cu_3O_x$, where x stands for values between 10 and 13.

16. A resistive current limiter comprising a high-temperature superconducting material in the form of a hollow cylinder wherein the high-temperature super-conducting material is a polynary oxide containing bismuth, calcium, strontium, and copper, and wherein the polynary oxide additionally contains lead.

* * * * *

UNITED STATES PATENT AND TRADEMARK OFFICE
CERTIFICATE OF CORRECTION

PATENT NO. : 5,231,369
DATED : July 27, 1993
INVENTOR(S) : Eberhard Preisler

It is certified that error appears in the above-indentified patent and that said Letters Patent is hereby corrected as shown below:

Column 3, line 46 (claim 4, line 1), after "claim" insert -- 3 --.

Signed and Sealed this

Twelfth Day of April, 1994

Attest:

BRUCE LEHMAN

*Attesting Officer*     *Commissioner of Patents and Trademarks*